United States Patent
Wang et al.

(10) Patent No.: US 9,401,374 B2
(45) Date of Patent: Jul. 26, 2016

(54) PIXEL STRUCTURE, DUAL GATE PIXEL STRUCTURE AND DISPLAY DEVICE

(71) Applicant: Beijing BOE Optoelectronics Technology Co., Ltd., Beijing (CN)

(72) Inventors: Shijun Wang, Beijing (CN); Hailin Xue, Beijing (CN); Chuncheng Che, Beijing (CN)

(73) Assignee: BEIJING BOE OPTOELECTRONICS, Beijing (CN)

( * ) Notice: Subject to any disclaimer, the term of this patent is extended or adjusted under 35 U.S.C. 154(b) by 161 days.

(21) Appl. No.: 13/995,455

(22) PCT Filed: Mar. 15, 2013

(86) PCT No.: PCT/CN2013/072762
§ 371 (c)(1),
(2) Date: Jun. 18, 2013

(87) PCT Pub. No.: WO2013/170657
PCT Pub. Date: Nov. 21, 2013

(65) Prior Publication Data
US 2014/0145197 A1    May 29, 2014

(30) Foreign Application Priority Data
May 17, 2012  (CN) .................... 2012 2 0224642 U

(51) Int. Cl.
*H01L 27/14* (2006.01)
*H01L 27/12* (2006.01)
*G02F 1/1362* (2006.01)

(52) U.S. Cl.
CPC ............ *H01L 27/124* (2013.01); *G02F 1/1362* (2013.01)

(58) Field of Classification Search
USPC ......... 257/59, 72, E27.131, E27.132; 349/42, 349/43
See application file for complete search history.

(56) References Cited

U.S. PATENT DOCUMENTS

| | | | | |
|---|---|---|---|---|
| 7,372,513 | B2 * | 5/2008 | Choi | 349/40 |
| 7,709,304 | B2 * | 5/2010 | Park et al. | 438/149 |
| 7,768,601 | B2 * | 8/2010 | Kim | 349/110 |
| 8,253,873 | B2 * | 8/2012 | Sasaki et al. | 349/38 |
| 2012/0112987 | A1 | 5/2012 | Tan | |

FOREIGN PATENT DOCUMENTS

| | | |
|---|---|---|
| CN | 201867560 U | 6/2011 |
| CN | 202661759 U | 1/2013 |
| JP | 200564487 A | 3/2005 |

OTHER PUBLICATIONS

International Search Report (Chinese language) issued by the International Searching Authority, rendered May 17, 2012, 11 pages.
English abstract of CN202661759(U) listed above, 2 pages, Jan. 9, 2013.
English abstract of CN201867560(U) listed above, 17 pages, Jun. 15, 2011.
English abstract of JP200564487(A) listed above, 38 pages, Mar. 10, 2005.

* cited by examiner

*Primary Examiner* — Minh-Loan Tran

(57) ABSTRACT

According to the present disclosure, there are disclosed a pixel structure, a dual-gate pixel structure and a display device. The pixel structure comprises: a thin film transistor, a passivation layer that is located over the thin film transistor, an upper pixel electrode that is located over the passivation layer, a lower pixel electrode that is located under a gate insulating layer of the thin film transistor; and a common voltage line that is located between the passivation layer and the gate insulating layer. The common voltage line overlaps with the lower pixel electrode and the upper pixel electrode at least in part with the gate insulating layer and the passivation layer interposed therebetween, respectively, so as to form a storage capacitance.

19 Claims, 2 Drawing Sheets

PIXEL STRUCTURE, DUAL GATE PIXEL STRUCTURE AND DISPLAY DEVICE

CROSS REFERENCE TO RELATED APPLICATIONS

This application is based on International Application No. PCT/CN2013/072762 filed on Mar. 15, 2013, which claims priority to Chinese National Application No. 201220224642.6, filed on May 17, 2012, the contents of which are incorporated herein by reference.

FIELD OF THE INVENTION

The present disclosure relates to a pixel structure, a dual-gate pixel structure and a display device.

BACKGROUND

One performance index that is very important in liquid crystal displays is luminance, and the most important factor in determining the luminance is aperture ratio, which refers to the ratio held by an effective transmission region of one pixel in the whole area of the entire pixel.

Currently, the resolution of cell phone products is getting higher and higher, the pixel pitch is getting smaller and smaller, and the aperture ratio of twisted nematic (TN) mode products becomes a bottleneck. Regarding the TN mode products, in order to prevent generation of flicker, the amount of a storage capacitance Cst must be ensured, and thus aperture ratio is restricted greatly. For dual-gate liquid crystal panels, the aperture ratio is lower.

FIG. 1 is a schematic view showing a pixel structure of a conventional liquid crystal panel of a TN mode, in which, between a pixel electrode 7 and a common voltage line 8 (Vcom), there are two insulating layers, i.e. an insulating layer 5 (PVX) and a gate insulating layer 6 (GI). In order to guarantee the storage capacitance Cst, there must be a larger facing area, and area of the common voltage line 8 (Vcom) needs to be made larger. However, after the area of the common voltage line 8 (Vcom) is increased, the aperture ratio will be degraded.

SUMMARY

In view of this, one of objects of the present disclosure is to provide a pixel structure, a dual-gate pixel structure and a display device, for solving a technical problem of a conventional dual-gate pixel structure that the aperture ratio is low.

According to an embodiment of the present disclosure, there is provided a pixel structure, comprising: a thin film transistor, which includes a gate electrode, a gate insulating layer, an active layer and a source and drain electrode layer stacking in sequence, the source and drain electrode layer including a source electrode and a drain electrode, the gate insulating layer being extended to a region of the pixel structure outside the thin film transistor; a passivation layer, which covers the thin film transistor, and is extended to the region of the pixel structure outside the thin film transistor; a lower pixel electrode, located under the gate insulating layer; an upper pixel electrode, located over the passivation layer, the lower pixel electrode and the upper pixel electrode being connected through a via hole, and at least one of the lower pixel electrode and the upper pixel electrode being connected to the drain electrode of the source and drain electrode layer; and a common voltage line, which is located between the gate insulating layer and the passivation layer, and overlaps with the lower pixel electrode and the upper pixel electrode at least in part with the gate insulating layer and the passivation layer interposed therebetween, respectively, so as to form a storage capacitance.

In one example, the upper pixel electrode is connected to the lower pixel electrode through the via hole that passes through the passivation layer and the gate insulating layer.

In one example, the thin film transistor has a bottom gate structure, the gate electrode, the gate insulating layer, the active layer and the source and drain electrode layer are stacked in sequence from bottom to top; and the lower pixel electrode and the gate electrode are located in a same layer.

In one example, the upper pixel electrode is connected to the drain electrode through a via hole penetrating the passivation layer.

In one example, the common voltage line and the source and drain electrode layer are located in a same layer, and are formed by a same metallic material.

In one example, the thin film transistor has a top gate structure, the source and drain electrode layer, the active layer, the gate insulating layer and the gate electrode are stacked in sequence from bottom to top; and the lower pixel electrode and the source and drain electrode layer are located in a same layer.

In one example, the drain electrode in the source and drain electrode layer is located on the side close to the lower pixel electrode, and the lower pixel electrode is directly connected to the drain electrode.

In one example, the common voltage line and the gate electrode are located in a same layer.

In one example, there is only the passivation layer between the upper pixel electrode and the common voltage line; and there is only the gate insulating layer between the lower pixel electrode and the common voltage line.

In another embodiment of the present disclosure, there is provided a dual-gate pixel structure, which includes two sub-pixel structures, wherein, each of the sub-pixel structures can be any pixel structure stated above, and source electrodes of thin film transistors of the two sub-pixel structures are electrically connected to each other.

In still another embodiment of the present disclosure, there is provided a display device, which includes any pixel structure or dual-gate pixel structure as stated above.

Pixel electrode layers in upper and lower levels are used by the present disclosure to form the storage capacitance together with the common voltage line, so that the overlapping area between the pixel electrode layers and the common voltage line is increased. There is only the gate insulating between the lower pixel electrode and the common voltage line, and there is only the passivation layer between the upper pixel electrode and the common voltage line, and thus the distance between the two-layered pixel electrode and the common voltage line is decreased. Because the medium layer between the pixel electrode and the common voltage line is decreased in thickness and the overlapping area is increased, the storage capacitance can be increased. In the event that the amount of the storage capacitance is constant, width of the common voltage line can be decreased with technical solutions of the present disclosure, and thereby aperture ratio is effectively increased.

BRIEF DESCRIPTION OF THE DRAWINGS

In order to illustrate the technical solution of the embodiments of the invention more clearly, the drawings of the embodiments will be briefly described below; it is obvious that the drawings as described below are only related to some embodiments of the invention, but not limitative of the invention.

DETAILED DESCRIPTION

In order to make objects, technical details and advantages of the embodiments of the invention apparent, hereinafter, the technical solutions of the embodiments of the invention will be described in a clearly and fully understandable way in connection with the drawings related to the embodiments of the invention. It is obvious that the described embodiments are just a part but not all of the embodiments of the invention. Based on the described embodiments of the invention, those ordinarily skilled in the art can obtain other embodiment(s), without any inventive work, which is (are) within the scope sought for protection by the invention.

Figure 1:
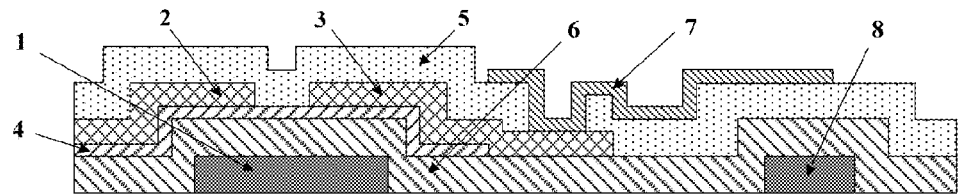
FIG. 1 is a schematic view showing a conventional dual-gate pixel structure of a twisted nematic type.
Figure 2:
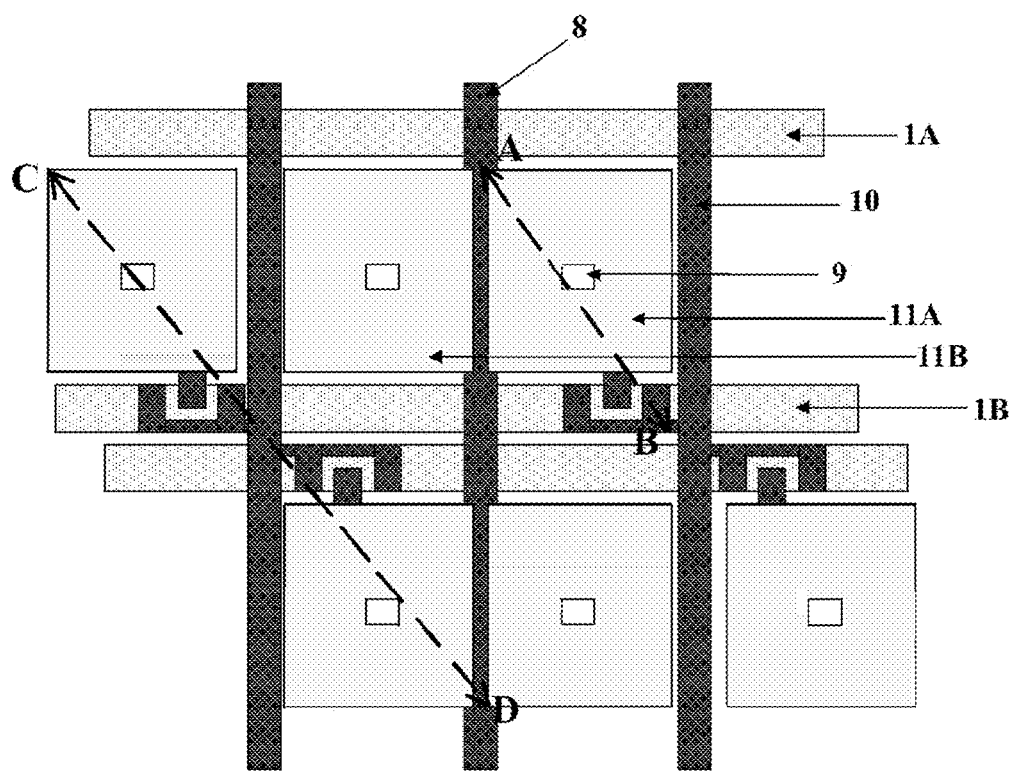
FIG. 2 is a top view showing a liquid crystal panel adopting a pixel structure provided by an embodiment of the present disclosure.

FIG. 2 is a top view showing a liquid crystal panel adopting a dual-gate pixel structure that is provided by an embodiment of the present disclosure. As can be seen from FIG. 2, pixel electrodes in upper and lower levels for each of sub-pixel units are connected through a via hole 9, and pixel electrodes of two sub-pixel units 11A and 11B overlap a common voltage line 8, respectively. One row of sub-pixel array needs to be driven by two gate lines, for example, one row of pixels between a gate line 1A and a gate line 1B needs to be driven by the gate line 1A and the gate line 1B simultaneously, and one data line 10 is connected to two columns of sub-pixel units (for example, it is connected to source electrodes of thin film transistors of the sub-pixel units). In addition, FIG. 2 only schematically shows the pixel structure according to the embodiment of the present disclosure. Size proportions of individual parts shown in the figure are not necessarily drawn according to actual size proportions.

Figure 3:
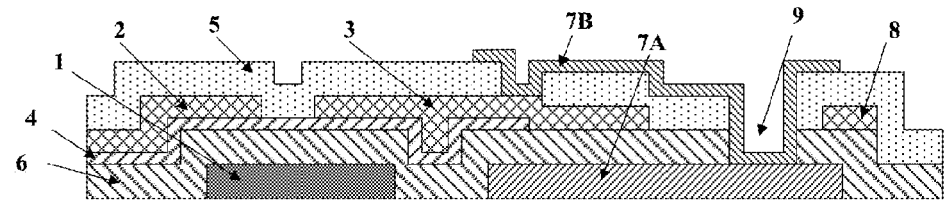
FIG. 3 is a schematic view showing the pixel structure provided by the embodiment of the present disclosure after it is cut roughly along a direction AB of FIG. 2.

FIG. 3 is a schematic view showing the pixel structure provided by the embodiment of the present disclosure after it is cut roughly along a direction AB of FIG. 2.

The pixel structure includes: a gate electrode 1, in a lowest layer; a lower pixel electrode 7A, located in the same layer as the gate electrode 1; a gate insulating layer 6, covering the gate electrode 1 and the lower pixel electrode 7A; a source electrode 2 and a drain electrode 3 (a layer of source and drain electrodes); an insulating layer 5, covering the source electrode 2 and drain electrode 3; an upper pixel electrode 7B, electrically connected to the drain electrode 3 and the lower pixel electrode 7A; a semiconductor layer 4, which is located over the gate insulating layer 6 and under the source electrode 2 and the drain electrode 3, and is joined to the source electrode 2 and the drain electrode 3; an insulating layer 5, covering the source electrode 2 and the drain electrode 3; and a common voltage line 8, located between the upper pixel electrode 7B and the lower pixel electrode 7A. Insulating materials are filled between the common voltage line 8 and the upper and lower pixel electrodes 7B and 7A, respectively, so as to ensure that the upper and lower pixel electrodes and the common voltage line 8 together form a storage capacitance Cst.

The above gate electrode 1, the gate insulating layer 6, the semiconductor layer 4 and the layer of source and drain electrodes 2 and 3 constitute a thin film transistor (TFT). The thin film transistor of the pixel structure may be located at one corner of a region where the pixel structure is located, but the present invention does not set a concrete limit to the specific location of the thin film transistor in the pixel structure. In addition, the gate insulating layer 6 of the thin film transistor may be extended to outside of the thin film transistor, for example, it may be extended to the entire region of the pixel structure.

Further, the above insulating layer 5 can serve as a passivation layer, which may be extended to outside of the thin film transistor. For example, it may be laid on the entire region of the pixel structure after the thin film transistor is formed. As regards material for the insulating layer, it may be any suitable insulating material, and the present disclosure does not make a special limitation of this.

For example, the upper pixel electrode 7B may be located above the insulating layer 5, and the lower pixel electrode 7A may be located below the gate insulating layer 6. For example, with respect to the plane position, large parts of the upper pixel electrode 7B and the lower pixel electrode 7A may be located outside the thin film transistor. Certainly, it may also be possible that a small part overlaps the drain electrode, so as to achieve the electric connection to the drain electrode.

For example, the common voltage line 8 may be located between the insulating layer 5 and the gate insulating layer 6. For example, with respect to plane position, the common voltage line may be located between each column of pixels among the pixel array, and thus, the common voltage line may overlap edge portions of the pixel electrodes 7A and 7B at least in part. The common voltage line 8 overlaps with the lower pixel electrode 7A and the upper pixel electrode 7B at least in part with the gate insulating layer 6 and the insulating layer 5 interposed therebetween, respectively, so as to form the storage capacitance Cst.

In a preferred embodiment of the present disclosure, in a vertical direction (a stacking direction of each layer), the upper pixel electrode 7B and the lower pixel electrode 7A may be opposed to each other fully, namely, the upper pixel electrode 7B and the lower pixel electrode 7A are aligned in the vertical direction. The upper pixel electrode 7B and the lower pixel electrode 7A are electrically connected through the via hole 9. The via hole 9 may penetrate the insulating layer 5 and the gate insulating layer 6. Of course, in one example, the upper pixel electrode 7B and the lower pixel electrode 7A may also overlap partially. The common voltage line 8 may overlap with both the upper pixel electrode 7B and the lower pixel electrode 7A at least in part, so as to ensure the upper and lower pixel electrodes and the common voltage line 8 together form the storage capacitance Cst. In the embodiment shown in FIG. 3, the gate insulating layer 6 is interposed between the common voltage line 8 and the lower pixel electrode 7A, and the insulating layer 5 is interposed between the upper pixel electrode 7B and the common voltage line 8.

In a direction extending along the gate line 1A shown in FIG. 2, the common voltage line 8 and the layer of source and drain electrodes 2 and 3 are located on two sides of the via hole 9, respectively. The common voltage line 8 overlaps partially with the upper pixel electrode 7B and the lower pixel electrode 7A in the vertical direction, and the upper and lower pixel electrodes 7A and 7B and the common voltage line 8 form the storage capacitance Cst. Of course, it may also be possible that the upper pixel electrode 7B and/or the lower pixel electrode 7A cover (s) the whole area of the common voltage line 8, so as to form the storage capacitance Cst jointly. Because the storage capacitance Cst is formed by the upper and lower pixel electrodes and the common voltage line 8 jointly, the overlapping area is increased, and further the storage capacitance Cst can be increased as compared to prior art.

In one example, the common voltage line 8 and source and drain electrodes 2 and 3 may be formed by the same metal layer or the same metallic material. For example, a source and drain metal layer for forming the source electrode 2 and the drain electrode 3 may be used to form the common voltage line in the same patterning process as the source electrode 2 and the drain electrode 3. However, the present disclosure is not limited thereto, the common voltage line may also be formed separately, or may adopt a material different from that for the source electrode 2 and the drain electrode 3.

In one example, as shown in FIG. 3, there is only the insulating layer 5 between the upper pixel electrode 7B and the common voltage line 8; and there is only the gate insulating layer 6 between the lower pixel electrode 7A and the common voltage line 8. Because there is only one insulating layer between the upper and lower pixel electrodes and the common voltage line 8, the distance is decreased. Thus, the storage capacitance Cst can be increased as compared to prior art.

As can be known from the above descriptions, if the width of the common voltage line 8 is the same, then as compared to prior art, the pixel structure according to the present disclosure can have a higher storage capacitance. Based on the above design, in the event that the amount of the desired storage capacitance Cst is constant, the aperture ratio can be effectively increased by way of decreasing the width of the common voltage line 8 (Vcom) according to technical solutions of the present disclosure.

For example, material for the upper and lower pixel electrodes is indium tin oxide. As can be understood by those ordinarily skilled in the art, except indium tin oxide is used as the pixel electrode, other conductible material having a high transmittance (a transmittance of at least 97% or more) can also be used as the pixel electrode. The present disclosure will not give examples one by one any longer.

Figure 5:
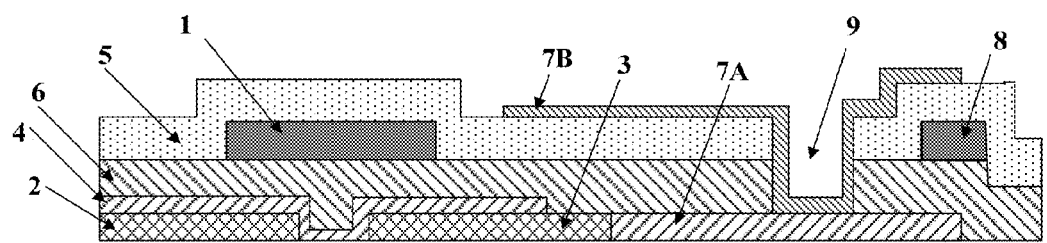
FIG. 5 is schematic view showing a pixel structure including a thin film transistor with a top-gate structure accrding to an embodiment of the invention.

In addition, regarding the positional relationship and the connecting relationship between the gate electrode 1, the gate insulating layer 6, the semiconductor layer 4 and the layer of source and drain electrodes of the above thin film transistor, any manner as well-known in the art may be adopted, details being omitted here. For example, only a bottom-gate thin film transistor has been described as an example in FIG. 3. As shown in FIG. 3, in the bottom-gate thin film transistor, the gate electrode 1, the gate insulating layer 6, the semiconductor layer 4 and the layer of source and drain electrodes are stacked in sequence from bottom to top. The upper pixel electrode 7B is connected to the drain electrode by the via hole passing through the insulating layer 5. However, the present invention may adopt a thin film transistor with a top-gate structure as well. FIG. 5 illustrates a pixel structure including a thin film transisitor with a top-gate structure according to an embodiment of the invention. In the thin film transistor with the top-gate structure, a layer of source and drain electrodes 2 and 3, a semiconductor layer 4, a gate insulating layer 6 and a gate electrode 1 are stacked in sequence from bottom to top.

For example, in the case of the thin film transistor with the top-gate structure, a lower pixel electrode 7A may be located in the same layer as the layer of source and drain electrodes 2 and 3. For example, the drain electrode 3 in the layer of source and drain electrodes may be located on the side close to the lower pixel electrode 7A, and directly connected to the lower pixel electrode, and the above-mentioned via hole for connecting the upper pixel electrode 7B and the drain electrode that passes through the insulating layer is no longer required. For example, in the case of the thin film transistor with the top-gate structure, a common voltage line 8 may be located in the same layer as the gate electrode 1. In addition, other configurations of a pixel structure of the thin film transistor with the gate-top structure may be the same as those of the pixel structure with the bottom-gate structure stated above, details being omitted here.

Figure 4:
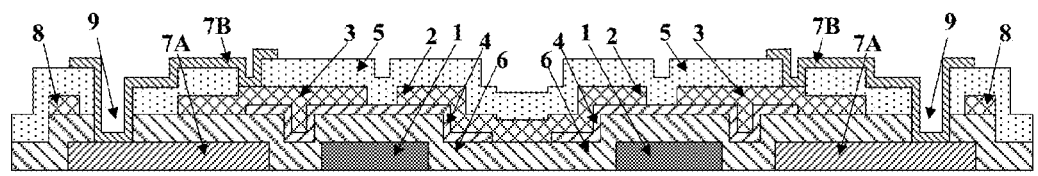
FIG. 4 is a schematic view showing the pixel structure provided by the embodiment of the present disclosure after it is cut roughly along a direction CD of FIG. 2.

FIG. 4 is a schematic view showing the pixel structure provided by the embodiment of the present disclosure after it is cut roughly along a direction CD of FIG. 2. As can be seen from the schematic view of the structure, there are two gate lines between electrodes for sub-pixels in two rows, namely, in a panel constituted by the pixel structure shown in FIG. 4, each row of sub-pixels is driven by two gate lines. In the dual-gate pixel structure according to embodiments of the present disclosure, each pixel structure may include two sub-pixel structures, and each of the sub-pixel structures may be any pixel structure stated above. Source electrodes of thin film transistors in these two sub-pixel structures are electrically connected to each other. For example, the source electrodes of the thin film transistors in these two sub-pixel structures may be both connected to the same data line on a substrate, so as to achieve electric connection between them. Of course, any other proper manner may also be used to achieve the electric connection.

According to an embodiment of the present disclosure, accordingly, there is further given a mask production flow of the pixel structure provided by embodiments of the present disclosure, which is divided into the following five mask processing steps:

A first step: a mask processing process of a gate line 1 is conducted;

A second step: a mask processing process of a lower pixel electrode layer 7A is conducted;

A third step: after a gate insulating layer 6 is deposited, the same metal layer is used to generate a source electrode 2, a drain electrode 3 and a common voltage line 8 through one mask processing process;

A fourth step: a mask processing process of an insulating layer 5 is conducted;

A fifth step: a mask processing process of a upper pixel electrode layer 7B is conducted.

Wherein, the lower pixel electrode layer 7A and the upper pixel electrode layer 7B may share the same mask, and as compared to four masking processes of a conventional liquid crystal panel, the cost is not increased.

The foregoing are merely exemplary embodiments of the invention, but are not used to limit the protection scope of the invention. The protection scope of the invention is determined by appended claims.

What is claimed is:
1. A pixel structure, comprising:
a thin film transistor, which includes a gate electrode, a gate insulating layer, an active layer and a source and drain electrode layer stacking in sequence, the source and drain electrode layer including a source electrode and a drain electrode, the gate insulating layer being extended to a region of the pixel structure outside the thin film transistor;
a passivation layer, which covers the thin film transistor, and is extended to the region of the pixel structure outside the thin film transistor;
a lower pixel electrode, located under the gate insulating layer;
an upper pixel electrode, located over the passivation layer, the lower pixel electrode and the upper pixel electrode being connected through a via hole, and at least one of the lower pixel electrode and the upper pixel electrode being connected to the drain electrode of the source and drain electrode layer; and
a common voltage line, which is located between the gate insulating layer and the passivation layer, and overlaps with the lower pixel electrode and the upper pixel electrode at least in part with the gate insulating layer and the passivation layer interposed therebetween, respectively, so as to form a storage capacitance.

2. The pixel structure according to claim 1, wherein, the upper pixel electrode is connected to the lower pixel electrode through the via hole that passes through the passivation layer and the gate insulating layer.

3. The pixel structure according to claim 1, wherein, the thin film transistor has a bottom gate structure, the gate electrode, the gate insulating layer, the active layer and the source and drain electrode layer are stacked in sequence from bottom to top; and
the lower pixel electrode and the gate electrode are located in a same layer.

4. The pixel structure according to claim 3, wherein, the upper pixel electrode is connected to the drain electrode through a via hole penetrating the passivation layer.

5. The pixel structure according to claim 3, wherein, the common voltage line and the source and drain electrode layer are located in a same layer, and are formed by a same metallic material.

6. The pixel structure according to claim 1, wherein, the thin film transistor has a top gate structure, the source and drain electrode layer, the active layer, the gate insulating layer and the gate electrode are stacked in sequence from bottom to top; and
the lower pixel electrode and the source and drain electrode layer are located in a same layer.

7. The pixel structure according to claim 6, wherein, the drain electrode in the source and drain electrode layer is located on the side close to the lower pixel electrode, and the lower pixel electrode is directly connected to the drain electrode.

8. The pixel structure according to claim 6, wherein, the common voltage line and the gate electrode are located in a same layer.

9. The pixel structure according to claim 1, wherein, there is only the passivation layer between the upper pixel electrode and the common voltage line; and there is only the gate insulating layer between the lower pixel electrode and the common voltage line.

10. A display device, including the pixel structure according to claim 1.

11. A dual-gate pixel structure, which includes two sub-pixel structures,
wherein, each of the sub-pixel structures comprises:
a thin film transistor, which includes a gate electrode, a gate insulating layer, an active layer and a source and drain electrode layer stacking in sequence, the source and drain electrode layer including a source electrode and a drain electrode, the gate insulating layer being extended to a region of the pixel structure outside the thin film transistor;
a passivation layer, which covers the thin film transistor, and is extended to the region of the pixel structure outside the thin film transistor;
a lower pixel electrode, located under the gate insulating layer;
an upper pixel electrode, located over the passivation layer, the lower pixel electrode and the upper pixel electrode being connected through a via hole, and at least one of the lower pixel electrode and the upper pixel electrode being connected to the drain electrode of the source and drain electrode layer; and
a common voltage line, which is located between the gate insulating layer and the passivation layer, and overlaps with the lower pixel electrode and the upper pixel electrode at least in part with the gate insulating layer and the passivation layer interposed therebetween, respectively, so as to form a storage capacitance,
wherein source electrodes of thin film transistors in the two sub-pixel structures are electrically connected to each other.

12. The dual-gate pixel structure according to claim 11, wherein,
the upper pixel electrode is connected to the lower pixel electrode through the via hole that passes through the passivation layer and the gate insulating layer.

13. The dual-gate pixel structure according to claim 11, wherein,
the thin film transistor has a bottom gate structure, the gate electrode, the gate insulating layer, the active layer and the source and drain electrode layer are stacked in sequence from bottom to top; and
the lower pixel electrode and the gate electrode are located in a same layer.

14. The dual-gate pixel structure according to claim 13, wherein,
the upper pixel electrode is connected to the drain electrode through a via hole penetrating the passivation layer.

15. The dual-gate pixel structure according to claim 13, wherein,
the common voltage line and the source and drain electrode layer are located in a same layer, and are formed by a same metallic material.

16. The dual-gate pixel structure according to claim 11, wherein,
the thin film transistor has a top gate structure, the source and drain electrode layer, the active layer, the gate insulating layer and the gate electrode are stacked in sequence from bottom to top; and
the lower pixel electrode and the source and drain electrode layer are located in a same layer.

17. The dual-gate pixel structure according to claim 16, wherein,
the drain electrode in the source and drain electrode layer is located on the side close to the lower pixel electrode, and the lower pixel electrode is directly connected to the drain electrode.

18. The dual-gate pixel structure according to claim 16, wherein,
the common voltage line and the gate electrode are located in a same layer.

19. The dual-gate pixel structure according to claim 11, wherein,
there is only the passivation layer between the upper pixel electrode and the common voltage line; and there is only the gate insulating layer between the lower pixel electrode and the common voltage line.

* * * * *